US005351176A

United States Patent [19]
Smith Stephen W. et al.

[11] Patent Number: 5,351,176
[45] Date of Patent: Sep. 27, 1994

[54] PANEL FOR A COMPUTER INCLUDING A HINGED DOOR WITH INTEGRAL DISPLAY

[75] Inventors: Smith Stephen W., South Lyon; Mark T. Oliver, Dexter, both of Mich.

[73] Assignee: North Atlantic Industries, Inc., Hauppauge, N.Y.

[21] Appl. No.: 999,216

[22] Filed: Dec. 31, 1992

[51] Int. Cl.$^5$ .................. H05K 5/03; H04N 5/64; G06F 1/16
[52] U.S. Cl. .................... 361/681; 348/827; 348/839; 312/302; 248/917
[58] Field of Search .............. 358/254; 364/708.1; 211/26; 312/223.1, 223.2, 223.3, 302, 309, 348.4, 7.2; 361/680–683, 724–726, 816, 818; 174/35 R, 35 GC; 345/905; 348/827, 839

[56] References Cited

U.S. PATENT DOCUMENTS

| | | |
|---|---|---|
| 4,514,920 | 5/1985 | Shafrir et al. . |
| 4,814,711 | 3/1989 | Olsen et al. ................ 324/331 |
| 5,010,322 | 4/1991 | Fry et al. ................ 174/35 R X |
| 5,021,763 | 6/1991 | Obear ................ 361/680 X |
| 5,027,111 | 6/1991 | Davis et al. . |
| 5,051,868 | 9/1991 | Leverault et al. . |
| 5,201,813 | 4/1993 | Ives et al. ................ 164/451 |
| 5,248,193 | 9/1993 | Schlemmer ................ 312/223.2 |

Primary Examiner—Leo P. Picard
Assistant Examiner—Michael W. Phillips
Attorney, Agent, or Firm—Dilworth & Barrese

[57] ABSTRACT

The present invention relates to front panel display construction for computers. The front panel includes a panel assembly secured to the computer having an opening formed therein so as to provide access to internal components of the computer. In addition, the front panel has a display member pivotably secured to the panel assembly which pivots between an open position and a closed position. In the open position the internal components of the computer are accessible to a user or operator and in the closed position, access to the internal components is inhibited.

28 Claims, 6 Drawing Sheets

PANEL FOR A COMPUTER INCLUDING A HINGED DOOR WITH INTEGRAL DISPLAY

BACKGROUND OF THE INVENTION

1. Field of the Invention

The present invention relates to front panel display construction for computers. More particularly, the present invention relates to a front panel display mounted in a hinged front panel of the computer.

2. Description of the Related Art

Computers and computer applications have evolved over the years to the point where computers are now widely used in a variety of environments for a variety of applications. One such environment is commonly known as a rugged environment which requires the internal components of a computer to be tolerant to vibration and mechanical shock, isolated frown moisture and/or dust, and isolated from electrical and/or magnetic fields. Further, the computer should be firmly secured in a housing while retaining the ability to be quickly removed. Typically, large racks are utilized to house the computer and other equipment associated with the computer.

Generally, computer equipment interfaces with a human operator through a display device, such as a monitor, and an input device, such as a keyboard or trackball. In addition to the interface equipment, computers also contain a processing system with internal memory, status indicators and computer controls, interface ports for communication with peripheral devices, and accessible mass storage devices, such as hard disk drives and/or floppy disk drives. Rackmounted equipment is normally used where space is at a premium, especially rack space, and in situations which require the ability to quickly repair and/or replace the unit should a failure occur. Frequent areas of computer failures occur in the following areas: the mass storage system; the display devices: the input devices; and/or the power supply. These features and components typically require large amounts of rack space, making standard type computers undesirable for rack mounted applications.

The front panel display assembly of the present invention permits use of minimal rack space while still providing an internal display and maximum access to computer controls, status indicators and mass storage devices. In addition, the present invention provides for quick and easy replacement and/or repair of the display device and the mass storage devices.

SUMMARY OF THE INVENTION

The present invention provides a front panel assembly for a computer. The front panel assembly comprises panel means releasably secured to the computer, and having an opening formed therein so as to provide access to internal components of the computer and display means for displaying images. The display means is pivotably secured to the panel means such that when the display means is pivoted to an open position, the opening in the panel means is exposed to a user. When the display means is pivoted to a closed position, access to the opening in the panel means is inhibited.

In the preferred embodiment, the panel assembly of the present invention further comprises first seal means disposed between the panel means and the computer and second seal means disposed between the panel means and the display means when the display means is in the closed position. Both seal means are provided to maintain the environmental integrity of the computer. Typically, the environmental integrity includes preventing electric, magnetic and/or other energy fields, moisture and dust from entering the computer, and preventing energy fields from exiting the computer. Preferably, each seal means comprises a conductive EMI and moisture resistant gasket. For example, each gasket may comprise a soft foam core and an outer nylon jacket which has been impregnated with silver and coated with a conductive, galvanically compatible coating.

In the preferred embodiment, the display means of the present invention comprises a display housing, a display medium for displaying the images which is disposed within the display housing and latching means for releasably securing the housing to the panel means. Preferably, the latching means releasably secures the display housing to the panel means so as to evenly distribute clamping forces between the latching means and the panel means along the second seal means to effect an environmental seal between the display housing and the panel means.

DETAILED DESCRIPTION OF THE PREFERRED EMBODIMENTS

Figure 1:
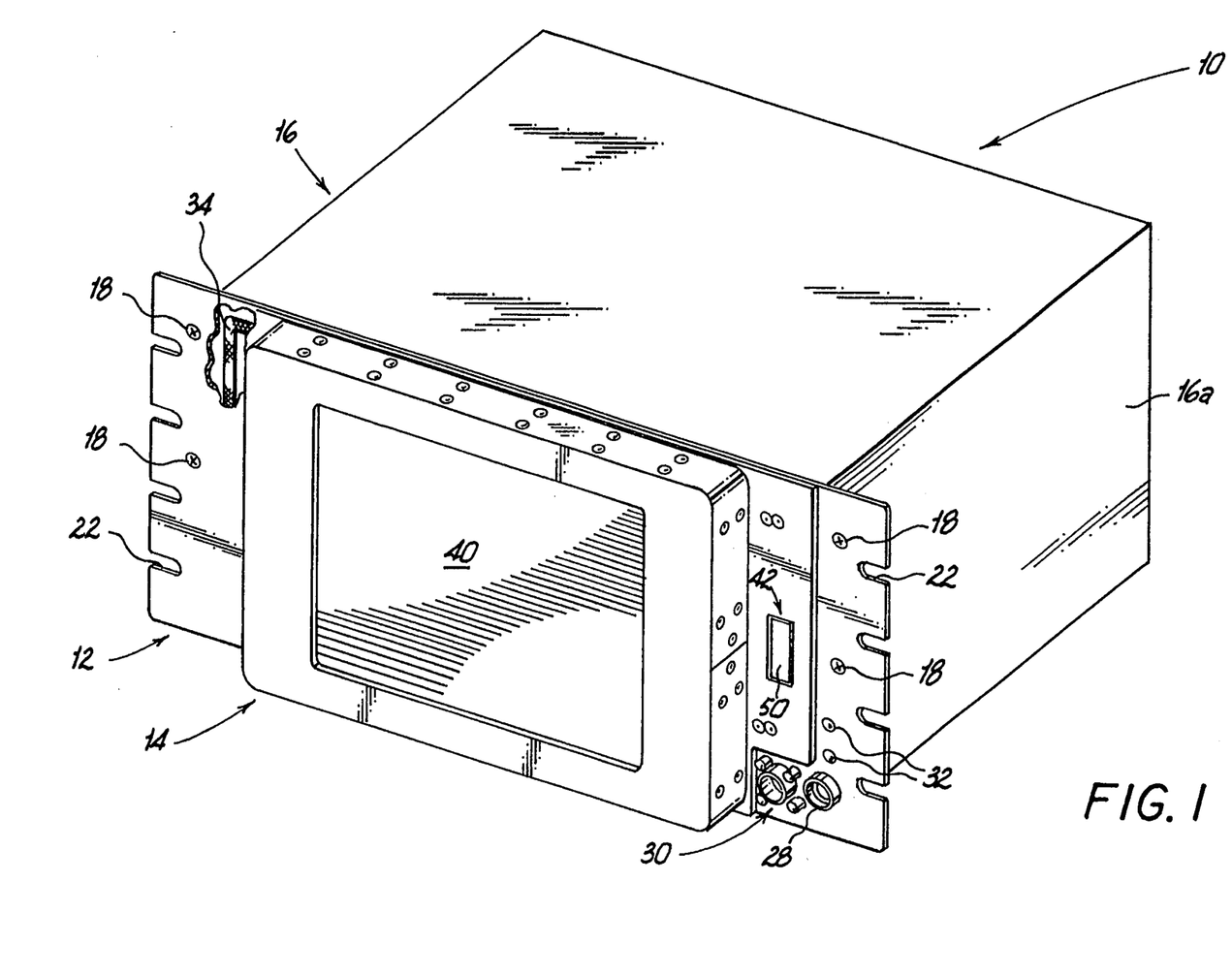
FIG. 1 is a perspective view of a computer assembly including the front panel display assembly of the present invention attached thereto.

Referring to FIG. 1, the computer front panel 10 of the present invention includes panel portion 12 and pivotable display portion 14. Panel portion 12 is secured to computer assembly 16 by screws 18. Generally, the front panel of the present invention serves numerous functions including, for example, the minimization of the rack space utilized, while providing a larger display medium than standard rack mounted computer systems with front panel displays. Another functional example, is that the pivotable display portion of the front panel allows easy access to the internal components of the computer, while maintaining the environmental integrity of the computer. The terms "environmental integrity", "environmentally sealed", "environmental construction" or like terms represent a construction of the front panel of the present invention which prevents the ingress or egress of electric, magnetic and/or other energy fields with respect to the computer assembly. In addition, this definition also includes a construction which prevents moisture, dust and the like from entering the computer assembly.

The computer assembly includes a microprocessor assembly (CPU) with internal memory (e.g., read only memory and random access memory), stored programs including application and system control programs, mass storage devices (e.g., fixed and removable drives), circuitry to communicate with periphery equipment (e.g., communication ports) and user interface circuitry (e.g., video interface and keyboard interface circuitry), all of which are known in the art. A block diagram of one embodiment according to the present invention is shown in FIG. 2, which illustrates the interconnections between the major components of the computer unit.

Figure 2:
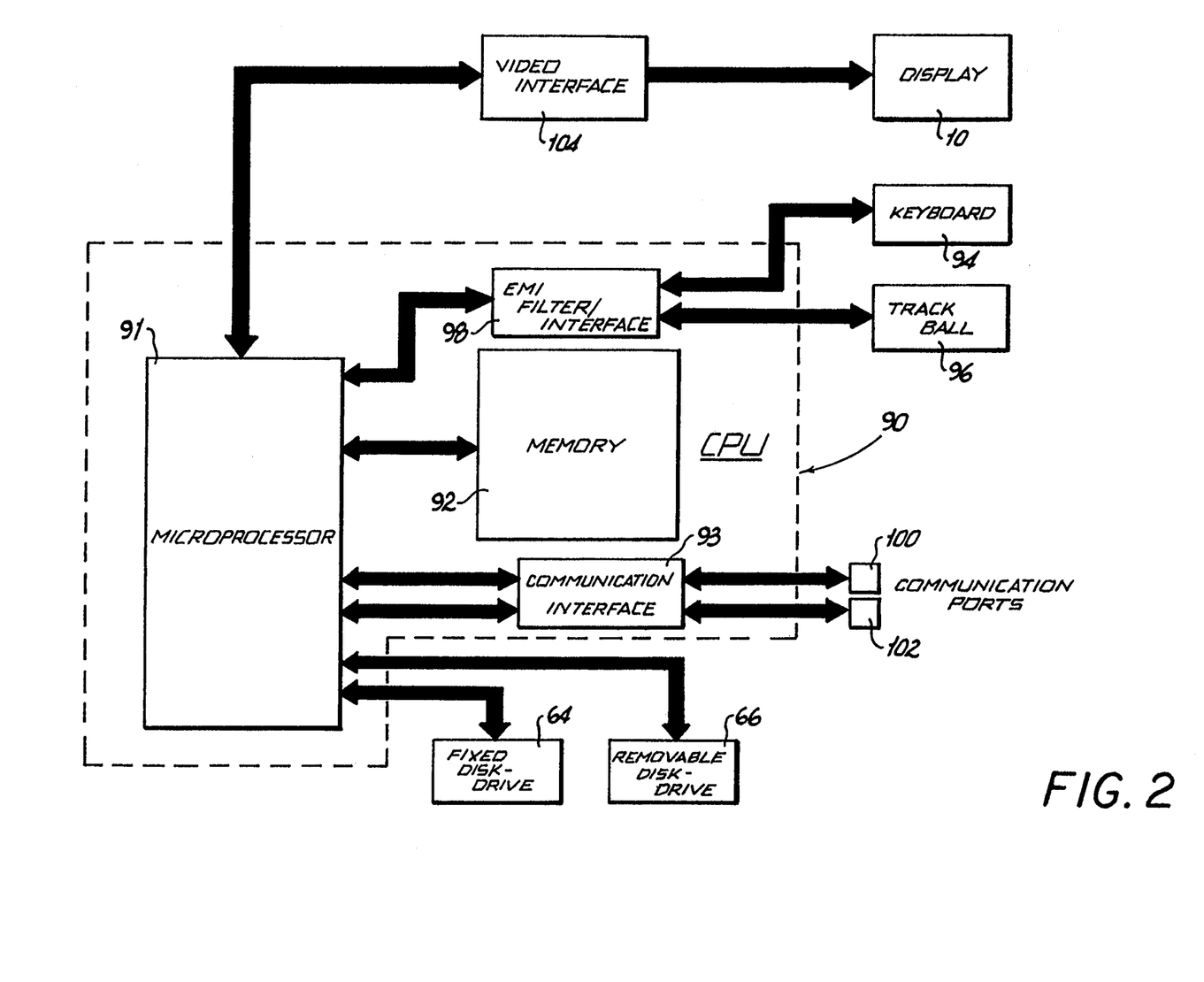
FIG. 2 is a block diagram of the interconnections between typical internal components of the computer assembly of FIG. 1.

Preferably, as shown in FIG. 2, CPU assembly 90 is a single printed circuit board (model CAT-1011 manufactured by Diversified Technology, Ridgeland, Miss.) which includes a 32 bit microprocessor 91 (model 80486 manufactured by Intel) interconnected to 32 megabytes of memory 92, as shown. CPU 90 is also connected to fixed disk drive 64 and removable disk drive 66, both of which are preferably 200 megabyte drives. Keyboard 94 and/or trackball 96 are operatively connected to CPU 90 via EMI filter/interface circuit 98, while display panel 10 of the present invention is operatively connected to CPU 90 via video interface circuit 104, both of which facilitate user interaction with the computer assembly. Communication ports 100 and 102 are also connected to CPU 90 via communication interface 93 to provide communication links between the computer assembly and external periphery devices. Typically, communication interface 93 provides parallel and/or serial communication links with the external periphery devices.

Figure 3:
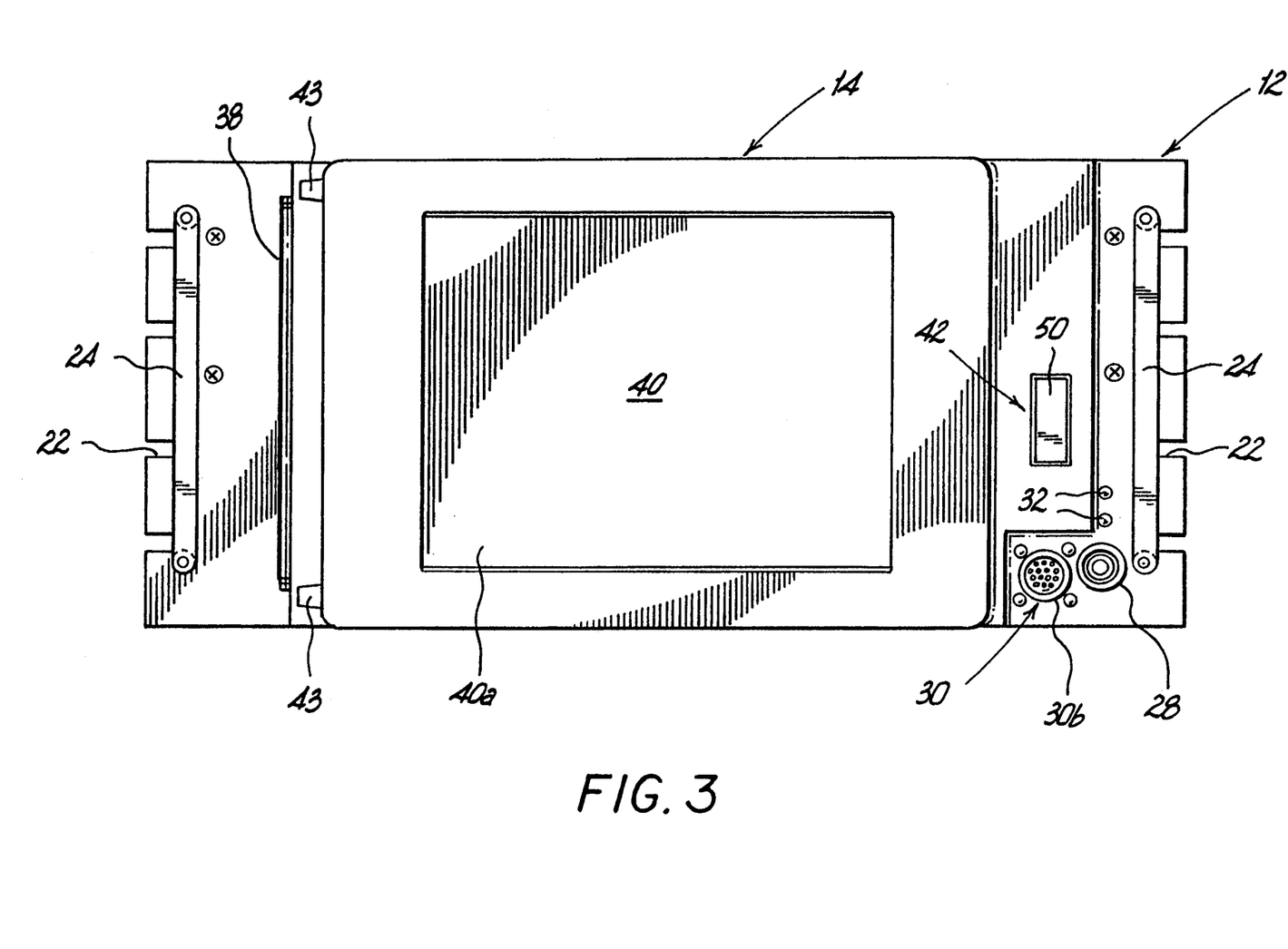
FIG. 3 is a front plan view of the front panel display assembly of FIG. 1.
Figure 4:
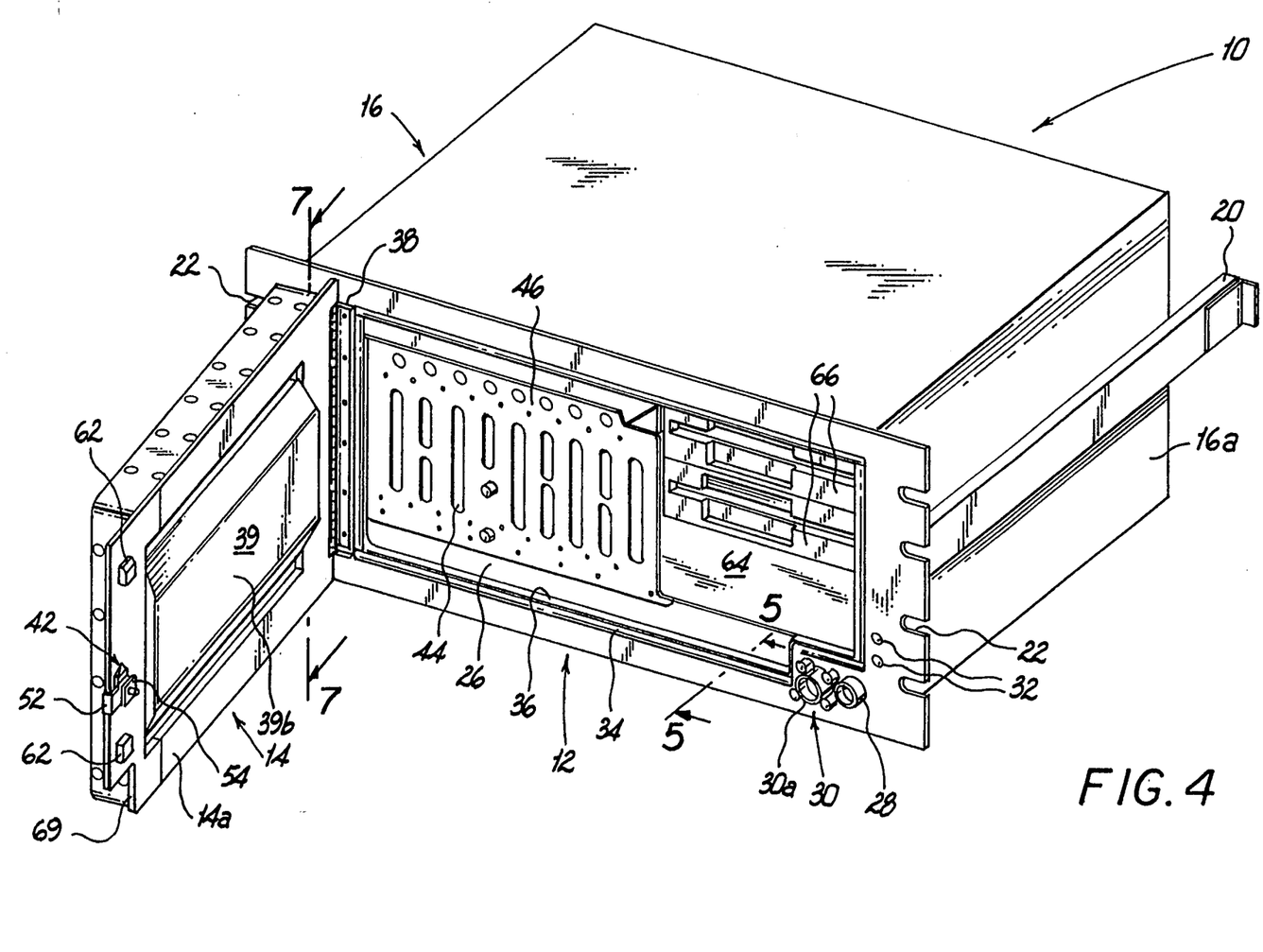
FIG. 4 is a perspective view of the computer of FIG. 1 adapted for rack mounting, and illustrating the front panel display in the open position so the internal components of the computer are accessible.

In one embodiment, computer assembly 16 may be adapted for rack mounting, as shown in FIG. 4. Computer assembly 16 may be slidably secured to the rack assembly (not shown) via guide rails 20 positioned on each side of computer assembly 16. Guide rails 20 are provided to engage corresponding guide tracks positioned within the rack. Channels 22 in front panel assembly 10 are provided to secure the computer assembly to the rack, and handles 24, shown in FIG. 3, may be provided to facilitate easy installation or withdrawal of the computer assembly. As noted, preferably, computer housing 16a of computer assembly 16 is configured, dimensioned and adapted for rack mounting. In this configuration, the dimensions of the housing may be about 20 inches in length by about 17 inches in width by about 8.75 inches in height to allow insertion into the rack.

Referring to FIG. 4, preferably, panel portion 12 is secured to computer assembly 16 so as to maintain the environmental integrity between the panel portion and the computer assembly. Alternately, panel portion 12 may be monolithically formed to the computer housing, thus removing the need for an environmental seal between the panel portion and the computer housing. Panel portion 12 is provided with opening 26 which allows access to the internal components of computer assembly 16, and includes power switch 28, user interface connector 30, status indicators 32 and seal member 34. Preferably, power switch 28 is operatively connected to the power supply system of the computer assembly and is secured to panel portion 12 so that when display portion 14 is in the closed position switch 28 is accessible to the computer user. In addition, power switch 28 is environmentally sealed so as to prevent moisture, dust, and electrical, magnetic and/or other energy fields from emitting from or entering computer assembly 16. User interlace 30 is also secured to panel portion 12 in a position where it remains accessible to the computer user when display portion 14 is in the closed position. A silicone EMI gasket may be provided between the engaging surfaces of interface 30 and panel portion 12 to environmentally seal the interface to the panel portion. Cover 30a may be positioned over the exposed portion of interface 30, shown in FIG. 4, for further environmental sealing of the interface and to protect pins 30b, shown in FIG. 3, within the interface. Typically, user interface 30 is a standard keyboard connector known in the art. User interface 30 and status indicators 32 are operatively connected to the above noted internal circuits of the computer assembly.

Figure 5:
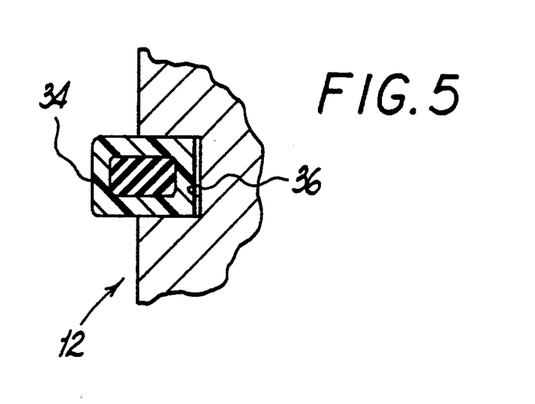
FIG. 5 is a partial cross-sectional view of the front panel display taken along line 5—5 of FIG. 4, illustrating an EMI-moisture resistant gasket positioned with a support channel.

Seal member 34 is secured to panel portion 12 around the perimeter of opening 26, as shown in FIG. 4. Seal member 34 is provided to maintain the environmental integrity between display portion 14 and panel portion 12. Preferably, seal member 34 is a conductive EMI and moisture resistant gasket secured within channel 36 of panel portion 12 by a conductive pressure sensitive adhesive, as shown in FIGS. 4 and 5. Gasket 34 is easily compressed when the interior perimeter surface 14a of display portion 14 engages the gasket so as to provide an electrical connection between the panel portion and the display portion, while still preventing the passage of moisture and dust into the computer assembly. One example of a suitable gasket is a SCHLEGEL®-C$^2$ EMI shielding gasket manufactured by SCHLEGEL®. This exemplary gasket, shown in FIG. 5, comprises a soft foam core and an outer nylon jacket that has been silver impregnated and coated with a conductive, galvanically compatible coating.

Referring to FIGS. 3 and 4, display portion 14 is pivotably secured to panel portion 12 via hinge 38 and includes display 39 and display window 40. Preferably, window 40 has an outer surface 40a coated with an anti-reflective material for improved viewing of the display. Display 39 may be any known flat panel display medium. An example of a suitable flat panel display medium is a color thin film transistor active matrix LCD display, model number LQ10DH11 manufactured by Sharp Electronics. The pivotal connection between panel portion 12 and display portion 14 allows the display portion to pivot between an open position, where the internal components of the computer are accessible through opening 26, as shown in FIG. 4, and a closed position, where the display portion is secured to panel portion 12 by latch assembly 42, as shown in FIG. 1. Stop members 43 may be provided to limit the pivotal movement of display portion 14 so as to prevent damage to the display portion when opening.

Cooling for display 39 is provided by convection created by internal fans within the computer assembly. Typically, the internal fans cause air to flow through openings 44 in shock and vibration isolated chassis 46, shown in FIG. 4, and impinge against the inner surface 39b of display 39 so as to dissipate heat generated by the display. However, other known methods for cooling display 39 may be provided. For example, the other surface of display portion 14 alone or in combination with panel portion 12 may act as a heat sink to dissipate heat.

Another example of a suitable cooling technique for both the internal circuit boards of the computer assembly and the front panel display of the present invention is by utilizing air plenum heatsinks. Air plenum heatsinks, allow cooling of the components (e.g., the internal circuit boards and/or the display of the computer assembly) while maintaining the environmental integrity of the computer assembly. Generally, the air plenum heatsink includes an open center area surrounded by an outer heat conductive medium, such as metal, and inlet and outlet ports which allows air within the open center area to be force through or withdrawn from the center area. The ports are arranged so that the external environment is prevented from breaching the internal environmental seal of the computer assembly, while allowing external air to pass through the open center area of the plenum to cool the heat conductive surface of the plenum. Typically, the air plenum heatsink is positioned adjacent to the component being cooled (e.g., the inner surface of the display) so that heat from the component is conducted to the heat conductive surface of the air plenum, via conduction, convection and/or radiation. A heat conductive material such as silicone or urethane binders containing thermally conductive fillers may be placed between the air plenum heatsink and the component to improve thermal transfer. The heat conductive surface is then cooled by the external air flowing through the open center area of the plenum. As a result, the internal components of the computer assembly are cooled without exposing the inside of the computer assembly to the external environment.

Figure 6:
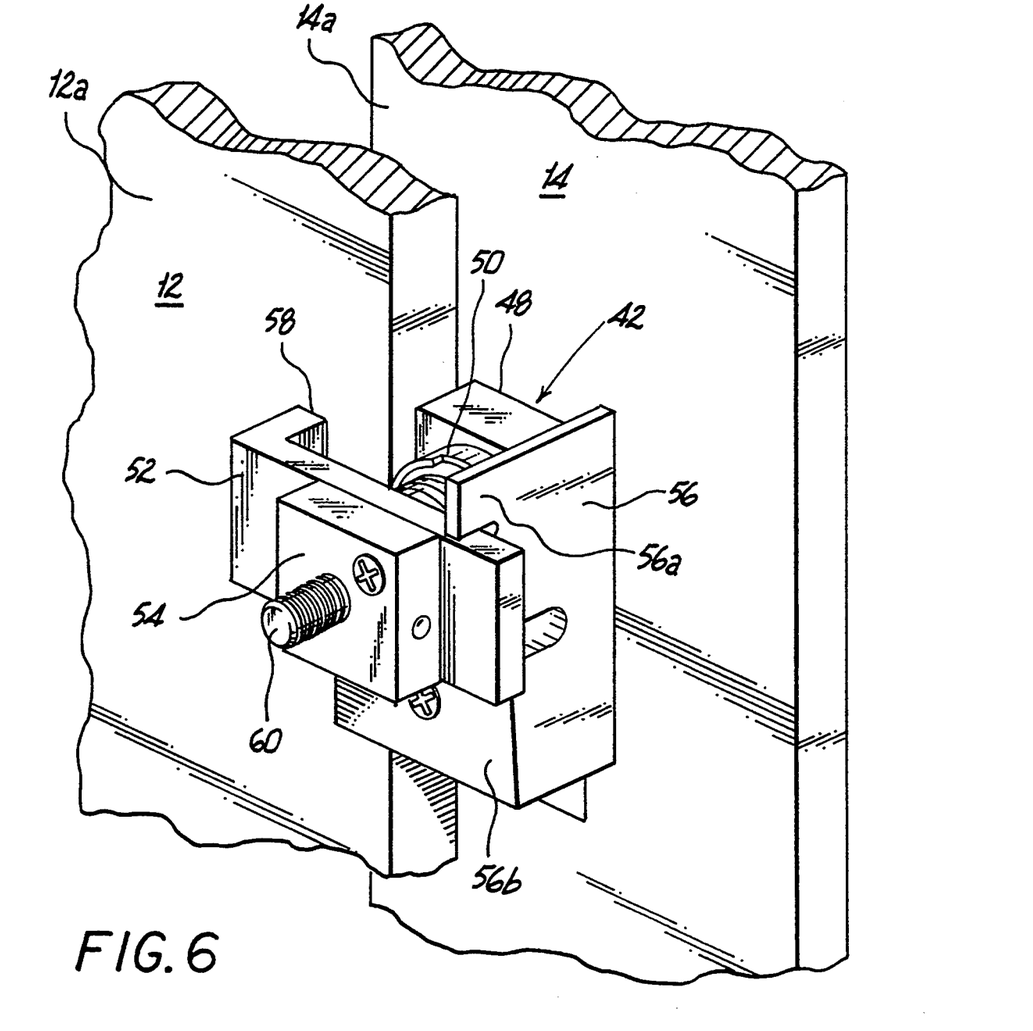
FIG. 6 is a partial perspective view, greatly enlarged, of the latching mechanism of the present invention.

Referring now to FIGS. 4 and 6, latch assembly 42 includes latch clamp 48 secured to a portion of interior enclosure 69 of display portion 14. Latch clamp 48 includes clamp actuating member 50 which extends through interior enclosure 69 to the outside surface of the display portion and is adaptable for manual activation. Pawl 52 and locking hub 54 are rotatably secured to clamp actuating member 50, as shown in FIG. 6. Pawl brace 56 includes pawl stop 56a which limits the rotational movement of pawl 52 to a predetermined angular orientation, preferably 90°, and pawl support 56b which maintains a substantial parallel orientation between pawl 52 and interior enclosure 69 of display portion 14 when clamp actuating member 50 is actuated. In this configuration, pawl support 56b prevents latch clamp 48 from over twisting pawl 52 so as to evenly distribute the clamping force of the latch clamp around display portion 14 and form the above noted environmental seal between the display portion and the panel portion. When the display portion is closed, clamp actuating member 50 is rotated so that engaging surface 58 of pawl 52 engages or cams against the interior surface 12a of panel portion 12, as shown in FIG. 6. The engagement of pawl 52 with panel portion 12 causes the above noted environmental seal, which is evenly distributed along seal member 34, as noted. Adjusting member 60, typically a threaded rod, is provided to incrementally increase or decrease the force between pawl 52 and panel portion 12 so as to form the appropriate environmental seal between the panel portion and the display portion.

As shown in FIG. 4, hinged display portion 14 is in the open position revealing the internal components of the computer. Typically, the length and weight of the display portion may be sufficient to create a torque on hinge 38 when the door is open. Over time this torque may effect the alignment between the display portion and the panel portion. As a result, wedge supports 62, preferably manufactured from a plastic such as DELRIN, may be provided to align panel portion 12 and display portion 14 when closing the display portion. In addition, wedge supports 62 prevent vertical movement of display portion 14 when in the closed position.

As noted above, when display portion 14 is in the open position, the internal components of the computer assembly are accessible to the user. As shown in FIG. 4, this exemplary computer assembly includes fixed disk drives 64 and removable disk drives 66 which are mounted on isolating chassis 46 to withstand shocks and/or vibrations encountered in the rugged environment.

Figure 7:
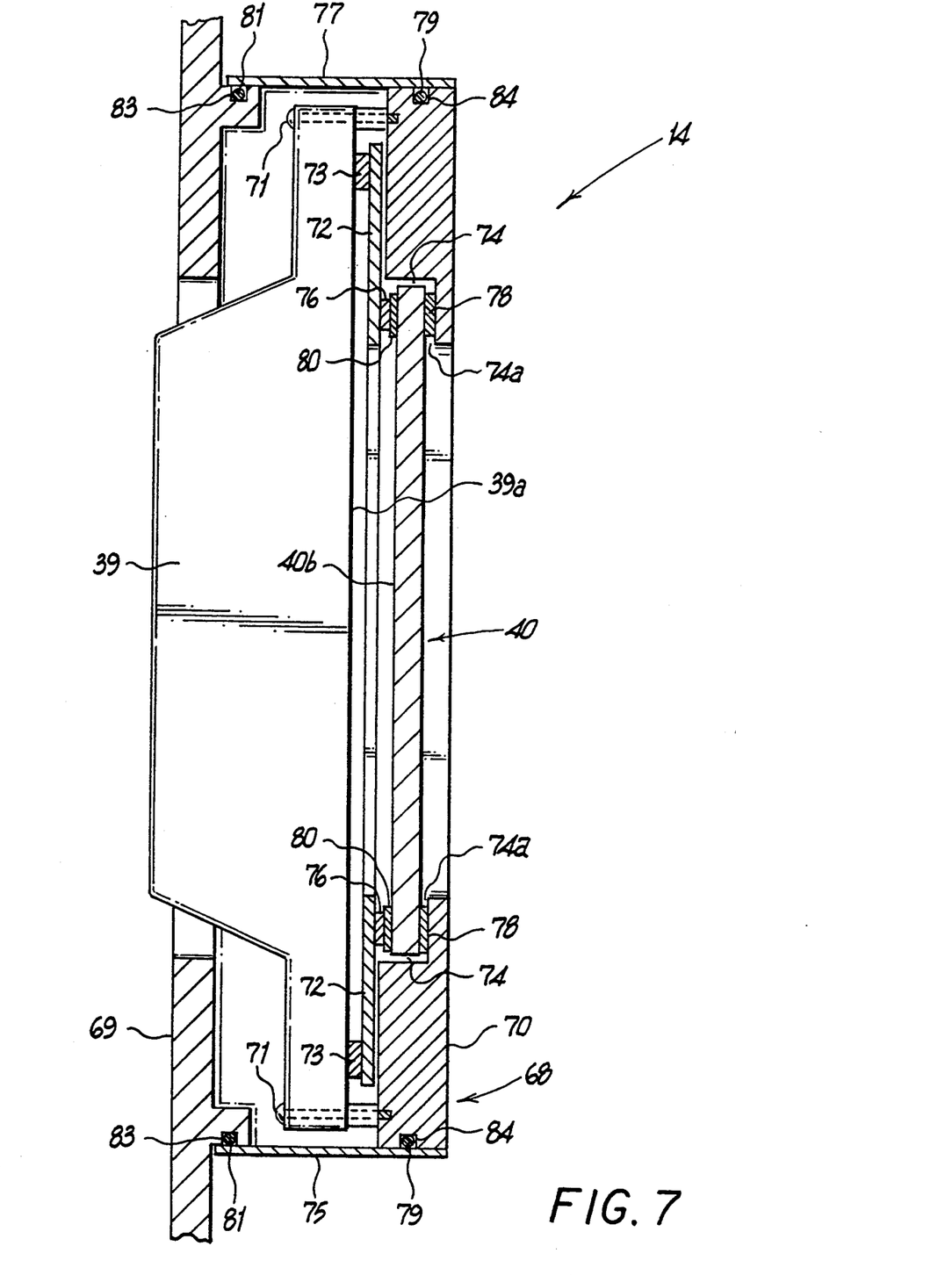
FIG. 7 is a cross-sectional view of a portion of the front panel display assembly of the present invention taken along line 7—7 of FIG. 4, and illustrating the sealing members between the display medium and the display housing.

Turning now to FIG. 7, the mounting configuration of display 39 and display window 40 within display housing 68 of display portion 14 will be described. Generally, display housing 68 includes interior enclosure 69, display window receiver 70, display window retainer 72 and panels 75 and 77, which maintain the display in a fixed, environmentally sealed relation to window 40. Display window 40 is positioned within channel 74 of window receiver 70 and window retainer 72 is secured to window receiver 70 by screws, clips or the like (not shown). Preferably, retainer 72 maintains display window 40 within channel 74 by a friction fit. Environmental sealing of the display window is provided by EMI gasket 76 and sealing compound 78.

EMI Gasket 76 is provided to prevent ingress or egress of electric, magnetic, and/or other energy fields with respect to the computer assembly. Preferably, EMI Gasket 76 has a soft foam core and an outer nylon jacket that has been silver impregnated and coated with a conductive, galvanically compatible coating, such as the SCHLEGEL ®-C$^2$ EMI shielding gasket manufactured by SCHLEGEL ®. Preferably, the inner surface 40b of display window 40 is coated with an electrically conductive medium, such as an indium-tin-oxide medium, which terminates in conductive bus bars 80. Bus bars 80 are electrically connected to display retainer 70 via conductive gasket 76 to complete the environmental sealing of the above noted energy fields. Sealing compound 78, on the other hand, is provided to prevent moisture, dust and the like from entering the computer assembly. Sealing compound 78, preferably a room-temperature vulcanizing compound, is positioned between display window 40 and bracing surface 74a of channel 74, as shown. As a result, moisture, dust and the like are prevented from entering the computer assembly through the display window.

Display 39 is secured to window receiver 70 by screws 71 so that display surface 39a of display 39 is in cooperative alignment with window 40 to form a display zone sufficient to allow viewing of the display. Sealing member 73 is positioned between display 39 and window retainer 72 so as to prevent dust, moisture and the like from entering the display zone.

Panels 75 and 77 are secured between interior enclosure 69 and window receiver 70, as shown, to complete housing 68. Housing gaskets 70 and 81 are positioned within corresponding channels 83 and 84, of interior enclosure 69 and window receiver 70, respectively, to provide further environmental sealing of housing 68. Preferably, housing gaskets 70 and 81 are conductive elastomer gaskets which compress when panels 75 and 77 are secured to the interior enclosure and the window receiver, so as to engage the panels and form the above noted environmental seal. An example of a suitable housing gasket is a Chomerics Hollow O-Strip elastomeric gasket (model 10-04-8363 manufactured by Chomerics).

It will be understood that various modifications can be made to the embodiments of the present invention herein disclosed without departing from the spirit and scope thereof. For example, various sizes of the display are contemplated, as well as various types of construction materials. Also, various modifications may be made in the configuration of the parts. Therefore, the above description should not be construed as limiting the invention but merely as exemplifications of preferred embodiments thereof. Those skilled in the art will envision other modifications within the scope and spirit of the present invention as defined by the claims appended hereto.

What is claimed is:

1. A front panel assembly for a computer, said front panel assembly comprising:
   panel means releasably securable to a computer, and having an opening formed therein so as to provide access to internal components of the computer; and
   a display for displaying images, pivotably secured to said panel means such that when said display is pivoted to an open position said opening in said panel means is exposed to a user and when said display is pivoted to a closed position access to said opening in said panel means is inhibited.

2. The front panel assembly according to claim 1 further comprising first seal means disposed between said panel means and the computer so as to maintain the environmental integrity of the computer.

3. The front panel assembly according to claim 2, wherein said environmental integrity includes preventing moisture and dust from entering the computer, and preventing energy fields from exiting the computer.

4. The front panel assembly according to claim 3, wherein said first seal means comprises a conductive EMI and moisture resistant gasket.

5. The front panel assembly according to claim 4, wherein said gasket comprises a soft foam core and an outer nylon jacket which has been impregnated with silver and coated with a conductive, galvanically compatible coating.

6. The front panel assembly according to claim 1 further comprising seal means disposed between said panel means and said display means such that when said display is in said closed position the environmental integrity between said panel means and said display is maintained.

7. The front panel assembly according to claim 6, wherein said seal means comprises a conductive EMI and moisture resistant gasket.

8. The front panel assembly according to claim 7, wherein said gasket comprises a soft foam core and an outer nylon jacket which has been impregnated with silver and coated with a conductive, galvanically compatible coating.

9. The front panel assembly according to claim 6, wherein said display means comprises:
   a display housing;
   a display medium for displaying said images disposed within said display housing; and
   latching means for releasably securing said housing to said panel means.

10. The front panel assembly according to claim 9, wherein said latching means includes a latch clamp secured to said display housing and configured to releasably secure said display housing to said panel means and to evenly distribute clamping forces between said latching means and said panel means along said seal means to effect an environmental seal between said display housing and said panel means.

11. A front panel assembly for a computer, said front panel assembly comprising:
    panel means releasably securable to a computer, and having an opening formed therein so as to provide access to internal components of the computer;
    a display for displaying images, pivotably secured to said panel means such that when said display is pivoted to an open position said opening in said panel means is exposed to a user and when said display is pivoted to a closed position access to said opening in said panel means is inhibited; and
    seal means for maintaining the environmental integrity between said panel means and said display.

12. The front panel assembly according to claim 11 further comprising latching means for releasably securing said display to said panel means.

13. The front panel assembly according to claim 11, wherein said seal means comprises a conductive EMI and moisture resistant gasket.

14. The front panel assembly according to claim 12, wherein said display comprises:
    a display housing; and
    a display medium disposed within said display housing for displaying said images.

15. A computer assembly comprising:
    a computer housing at least having processing means, stored program means for controlling the operation of said processing means, memory means for short term and long term storage of data and user interface circuitry;
    panel means releasably secured to said computer housing, and having an opening formed therein so as to provide access to components of said computer housing; and
    display means for displaying images, pivotably secured to said panel means such that when said display means is pivoted to an open position said opening in said panel means is exposed to a user and when said display means is pivoted to a closed position access to said opening in said panel means is inhibited.

16. The computer assembly according to claim 15 further comprising first seal means disposed between said panel means and the computer so as to maintain the environmental integrity of the computer.

17. The computer assembly according to claim 16, wherein said environmental integrity includes preventing moisture and dust from entering the computer, and preventing energy fields from exiting the computer.

18. The computer assembly according to claim 15 further comprising seal means disposed between said panel means and said display means such that when said display means is in said closed position the environmental integrity between said panel means and said display means is maintained.

19. The computer assembly according to claim 18, wherein said display means comprises:
    a display housing;
    a display medium for displaying said images disposed within said display housing; and
    latching means for releasably securing said housing to said panel means.

20. The computer assembly according to claim 19, wherein said latching means includes a latch clamp secured to said display housing and configured to releasably secure said display housing to said panel means and to evenly distribute clamping forces between said latching means and said panel means along said seal means to effect an environmental seal between said display housing and said panel means.

21. The computer assembly according to claim 15, wherein said components of said computer housing include at least one disk drive.

22. A computer assembly adapted for rack mounting comprising:

a computer housing having processing means, stored program means for controlling the operation of said processing means, and memory means for short term and long term storage of data, said computer housing being configured, dimensioned and adapted for rack mounting;

panel means releasably secured to said computer housing, and having an opening formed therein so as to provide access to internal components of said computer housing; and display means for displaying images pivotably secured to said panel means such that when said display means is pivoted to an open position said opening in said panel means is exposed to a user and when said display means is pivoted to a closed position access to said opening in said panel means is inhibited.

23. The computer assembly according to claim 22 further comprising latching means for releasably securing said display means to said panel means.

24. The computer assembly according to claim 22 further comprising seal means for preventing emission of energy fields from said computer housing and preventing moisture from entering said computer housing.

25. The computer assembly according to claim 22, wherein said internal components of said computer housing include at least one disk drive.

26. A computer assembly comprising:

panel means monolithically formed to a computer housing, said computer housing encloses at least a processor, stored programs for controlling the operation of said processor, memory for short term and long term storage of data, at least one disk drive and user interface circuitry, said panel means having an opening formed therein so as to provide access to components within said computer housing; and a display for displaying images, said display being dimensioned to occupy substantially an entire front portion of said panel means, and pivotably secured to said panel means such that when said display is pivoted to an open position said components including said disk drive are accessible to a user and when said display is pivoted to a closed position, access to said components is inhibited.

27. The computer assembly according to claim 26, further comprising latching means for releasably securing said display means to said panel means.

28. The computer assembly according to claim 25 further comprising seal means disposed between said panel means and said display means for preventing emission of energy fields from said computer housing and preventing moisture from entering said computer housing.

* * * * *